(12) United States Patent
Pon et al.

(10) Patent No.: US 11,399,434 B2
(45) Date of Patent: Jul. 26, 2022

(54) ELECTRONIC PACKAGE AND METHOD OF FORMING AN ELECTRONIC PACKAGE

(71) Applicant: Intel Corporation, Santa Clara, CA (US)

(72) Inventors: Florence Pon, Folsom, CA (US); Tyler Leuten, Orangevale, CA (US); Maria Angela Damille Ramiso, Folsom, CA (US)

(73) Assignee: Intel Corporation

( * ) Notice: Subject to any disclaimer, the term of this patent is extended or adjusted under 35 U.S.C. 154(b) by 777 days.

(21) Appl. No.: 16/157,187

(22) Filed: Oct. 11, 2018

(65) Prior Publication Data
US 2020/0120800 A1    Apr. 16, 2020

(51) Int. Cl.
| | |
|---|---|
| H05K 1/14 | (2006.01) |
| H05K 1/11 | (2006.01) |
| H05K 1/18 | (2006.01) |
| H01R 12/52 | (2011.01) |
| H05K 3/00 | (2006.01) |
| H05K 3/34 | (2006.01) |
| H05K 3/36 | (2006.01) |
| H05K 3/28 | (2006.01) |

(52) U.S. Cl.
CPC ............. *H05K 1/144* (2013.01); *H01R 12/52* (2013.01); *H05K 1/111* (2013.01); *H05K 1/117* (2013.01); *H05K 1/142* (2013.01); *H05K 1/181* (2013.01); *H05K 3/0052* (2013.01); *H05K 3/284* (2013.01); *H05K 3/3405* (2013.01); *H05K 3/3436* (2013.01); *H05K 3/368* (2013.01); *H05K 2201/09163* (2013.01); *H05K 2201/09172* (2013.01); *H05K 2201/10159* (2013.01); *H05K 2201/10446* (2013.01); *H05K 2201/10734* (2013.01)

(58) Field of Classification Search
USPC .................. 361/764, 767, 784, 790, 803; 257/685–730; 29/830
See application file for complete search history.

(56) References Cited

U.S. PATENT DOCUMENTS

6,222,739 B1 * 4/2001 Bhakta .................... G06F 1/184
                                                                257/686
8,189,328 B2 * 5/2012 Kanapathippillai ..... G11C 5/14
                                                                361/728

(Continued)

FOREIGN PATENT DOCUMENTS

WO    WO-2017111903 A1 *  6/2017  ........... H01L 25/065

*Primary Examiner* — Tuan T Dinh
(74) *Attorney, Agent, or Firm* — Schwabe, Williamson & Wyatt, P.C.

(57) ABSTRACT

Embodiments disclosed herein include modular electronics packages and methods of forming such packages. In an embodiment, the electronics package comprises a first connector module having a notch on a first end and a plurality of surface mount technology (SMT) pads on a second end. In an embodiment, the electronics package further comprises a second connector module having a keyed connector on a first end and a plurality of SMT pads on a second end. In an embodiment, the electronics package further comprises a system in package (SIP) module between the first connector module and the second connector module, the component module electrically and mechanically coupled to the SMT pads of the first connector and the SMT pads of the second connector.

21 Claims, 9 Drawing Sheets

(56) References Cited

U.S. PATENT DOCUMENTS

| | | | | |
|---|---|---|---|---|
| 8,345,441 B1* | 1/2013 | Crisp | ................... | G11C 5/063 |
| | | | | 361/790 |
| 8,493,745 B2* | 7/2013 | Co | ........................ | G06F 1/185 |
| | | | | 361/760 |
| 9,159,374 B2* | 10/2015 | Kim | ........................ | G11C 5/04 |
| 9,172,165 B1* | 10/2015 | Sass | ..................... | H01R 12/721 |
| 11,064,609 B2* | 7/2021 | Cok | ....................... | H01L 24/20 |
| 2007/0108592 A1* | 5/2007 | Lai | ....................... | H01L 21/561 |
| | | | | 257/700 |
| 2018/0190634 A1* | 7/2018 | Aoki | ...................... | H01L 25/18 |

* cited by examiner

ELECTRONIC PACKAGE AND METHOD OF FORMING AN ELECTRONIC PACKAGE

TECHNICAL FIELD

Embodiments of the present disclosure relate to electronics packaging, and more particularly, to modular PCB assemblies.

BACKGROUND

Different solid state drive (SSD) form factors typically require multiple board designs. This results in an increased bill of materials (BOM) that an assembly factory needs to track. Traditionally, SSDs use separate M.2 form factors for different sizes (i.e., 22×42 mm, 22×30 mm, etc.), thus wasting both PCB materials, board space, and development time. Another disadvantage of having separate form factors for different sizes is having to track different PCB inventories with the same architecture.

EMBODIMENTS OF THE PRESENT DISCLOSURE

Described herein are modular electronics packages and methods of forming such modular electronics packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, electronic packages are typically assembled on a single printed circuit board (PCB). In order to accommodate different form factors, the size of the PCB is changed. This requires many different PCBs to be tracked and the bill of materials (BOM) is increased. Furthermore, functional blocks (e.g., circuitry for power, debug, SPI, and/or crystals) may need to be redesigned and tested for the different form factors.

Accordingly, embodiments disclosed herein include a modular package design. In such embodiments, the end connectors (e.g., the notch side and the key side for an M.2 connector) are modular components. That is, the notch side connector and the key side connector are formed on different PCBs and are coupled together by a system in package (SIP) which is formed on a third PCB. In such embodiments, the notch side connector and the key side connector may be used with any SIP. Since the end connectors are agnostic to the SIP, modular packages with many different combinations may be used without needing to redesign the end connectors.

Additionally, the connectors and the SIP may be tested prior to assembly. As such, the testing requirements of the completed modular package are reduced. This increases yield, since all of the modular components of a package are known to be functional prior to assembly.

Embodiments also provide additional design flexibility. For example, since there is no PCB underlying the SIP, land side components may be added to the SIP. As such, additional real estate for components is generated. Such packages may provide improved performance due to the addition of more components.

Figure 1A:
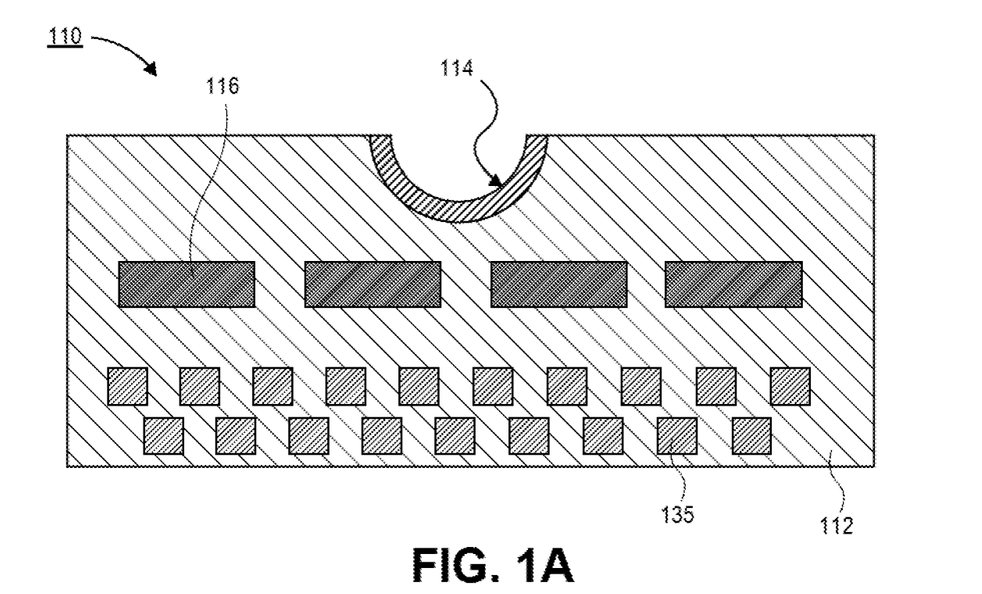
FIG. 1A is a plan view illustration of a notch side module that may be used in the assembly of a modular package, in accordance with an embodiment.

Referring now to FIG. 1A, a plan view illustration of a first connector module 110 is shown, in accordance with an embodiment. In an embodiment, the first connector 110 may be a notch side connector module (also referred to as a notch side module). In an embodiment, the notch side module 110 may be formed on a first PCB 112. In an embodiment, the notch side module 110 may comprise a plurality of pads 135. The pads 135 may be suitable for receiving solder balls (e.g., ball grid array BGA balls) connected to the SIP module (not shown). For example, pads 135 may be surface mount technology (SMT) pads or the like. Furthermore, it is to be appreciated that embodiments may also include other interconnect architectures, such as pin grid array (PGA) or land grid array (LGA)

In an embodiment, the notch side module 110 may comprise a plurality of functional blocks 116. The functional blocks 116 may include one or more circuitry blocks that are used in the modular package. The functional blocks 116 may include circuitry blocks for one or more of power, debug, SPI flash, and/or crystals. In an embodiment, the functional blocks 116 may be agnostic to the SIP module. For example, the functional blocks 116 may be used in conjunction with many different SIP modules. In an embodiment, the functional blocks 116 may be electrically coupled to the pads 135 by traces (not shown) in or on the PCB 112.

In an embodiment, the notch side module 110 may comprise a notch 114. The notch 114 may be any shape suitable for securing (e.g., with a screw) the modular package to a board (e.g., a motherboard). In an embodiment, the notch 114 may be formed along an edge of the PCB opposite from the edge that the pads 135 are formed. In an embodiment, a single notch 114 is used. However, it is to be appreciated that any number of notches 114 may be used, and the location of the notch 114 may be in locations other than what is shown in FIG. 1A. Furthermore, while a notch is shown, it is to be appreciated that any feature used for securing the modular package to a board may be used, in accordance with embodiments described herein.

Figure 1B:
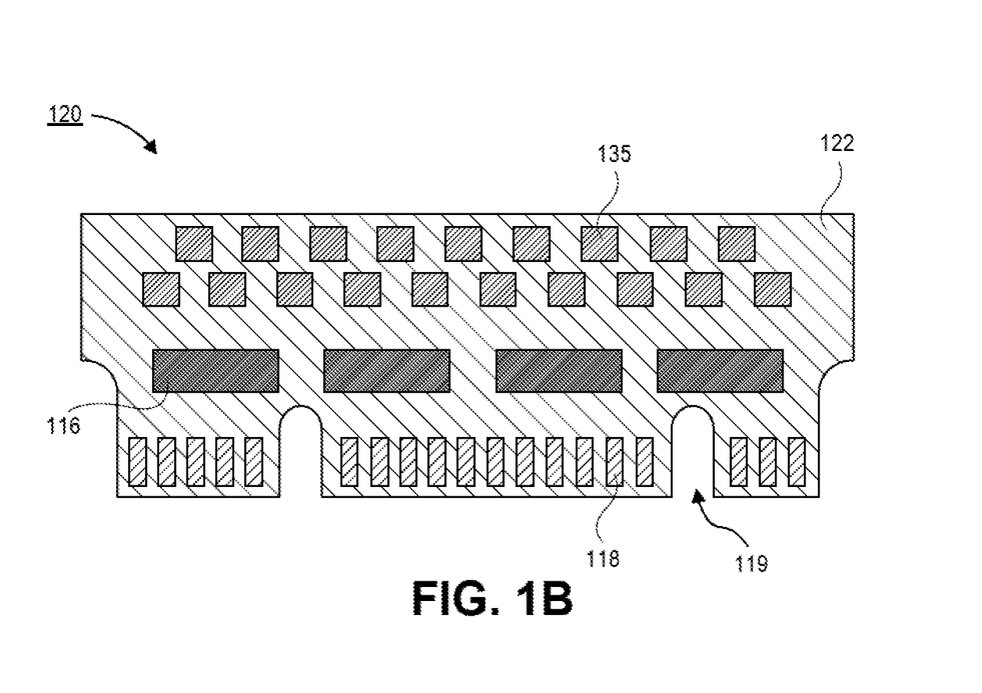
FIG. 1B is a plan view illustration of a key side module that may be used in the assembly of a modular package, in accordance with an embodiment.

Referring now to FIG. 1B, a plan view illustration of a second connector module 120 is shown, in accordance with an embodiment. In an embodiment, the second connector module 120 may be a key side connector module (also referred to as a key side module). In an embodiment, the key side module 120 may be formed on a second PCB 122. In an embodiment, the key side module 120 may comprise a plurality of pads 135. The pads 135 may be suitable for receiving solder balls (e.g., ball grid array BGA balls) connected to the SIP module (not shown). For example, pads 135 may be SMT pads or the like.

In an embodiment, the key side module 120 may comprise a plurality of functional blocks 116. The functional blocks 116 may include one or more circuitry blocks that are used in the modular package. The functional blocks 116 may include circuitry blocks for one or more of power, debug, SPI flash, and/or crystals. In an embodiment, the functional blocks 116 may be agnostic to the SIP module. For example, the functional blocks 116 may be used in conjunction with many different SIP modules. In an embodiment, the functional blocks 116 may be electrically coupled to the pads 135 by traces (not shown) in or on the PCB 122.

In an embodiment, the key side module 120 may comprise a plurality of pads 118 with notches 119 between some of the pads 118. It is to be appreciated that the number of pads 118 and the location of the notches 119 in FIG. 1B are exemplary in nature, and embodiments are not limited to what is illustrated in FIG. 1B. For example, different notch patterns and/or number of pads 118 may be used to provide different "keying" of the key side module 120. For example, different keying may be used for different types of components (e.g., a package module with a memory SIP may have a different keying than a package module with a wireless communication (e.g., WiFi) SIP). In an embodiment, the key side module 120 may include an M.2 connector, or any other suitable interface architecture for interfacing with a board (e.g., a motherboard).

Figure 1C:
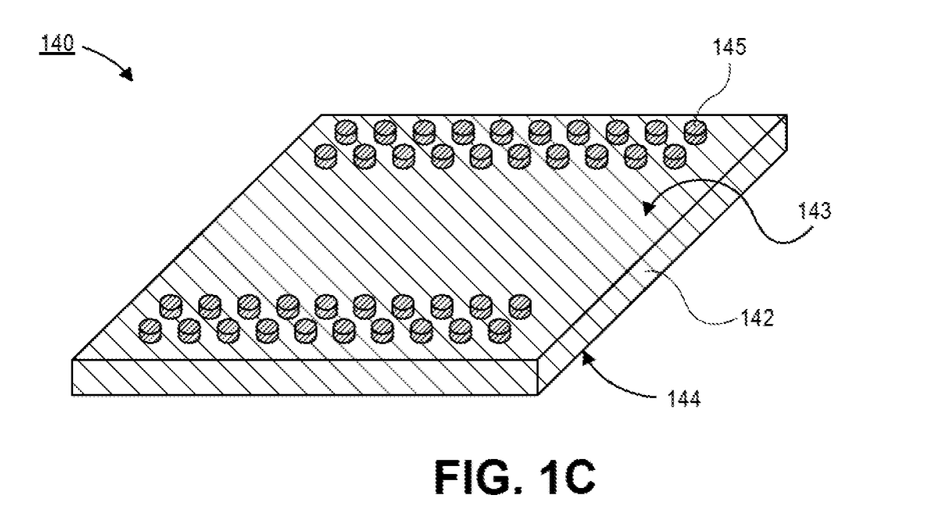
FIG. 1C is a perspective view illustration of a system in package (SIP) module that may be used in the assembly of a modular package, in accordance with an embodiment.

Referring now to FIG. 1C, a perspective view illustration of a SIP module 140 is shown, in accordance with an embodiment. In the embodiment shown, the bottom surface 143 of the PCB 142 on which the SIP module 140 is formed is visible. In an embodiment, the SIP module 140 may comprise any number of dies (not shown) needed for a desired purpose. For example, the dies may include memory dies (e.g., NAND flash, NOR flash, DRAM, etc.), processor dies (e.g., ASIC, etc.), wireless communication dies, power dies, or any other die. In a particular embodiment, the SIP module 140 may be a solid state drive (SSD).

In an embodiment, a plurality of attachment locations 145 are shown. In an embodiment, the attachment locations may comprise a BGA ball, PGA interconnect, LGA interconnect, or the like. In an embodiment, the attachment locations 145 are electrically coupled to devices (not shown) packaged on the top surface 144 of the PCB 142. In an embodiment, a first group of attachment points 145 may be located proximate to one edge of the PCB 142 and a second group of attachment points 145 may be located proximate to an opposite edge of the PCB 142. In an embodiment, the first attachment points 145 may be for connecting the SIP module 140 to the notch side module 110, and the second attachment points 145 may be for connecting the SIP module 140 to the key side module 120.

Figure 1D:
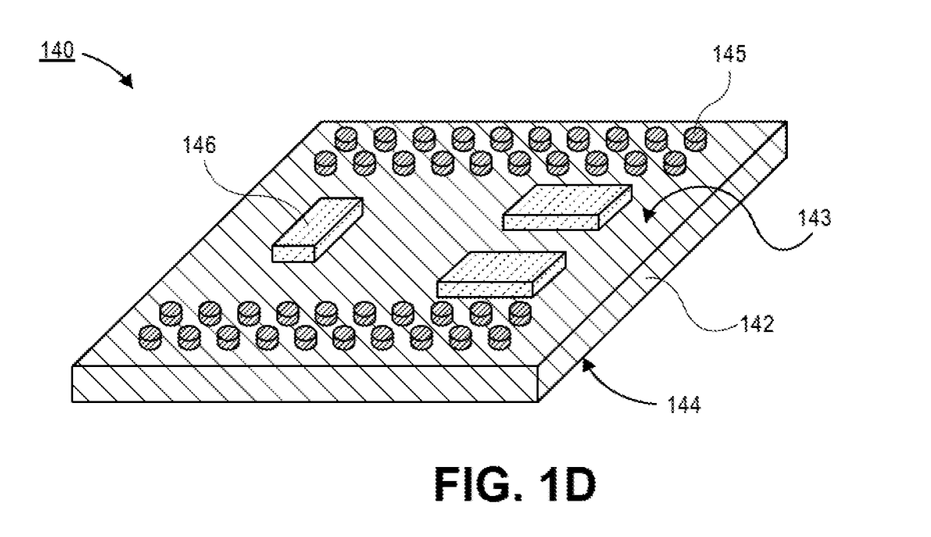
FIG. 1D is a perspective view illustration of a SIP module with land side components that may be used in the assembly of a modular package, in accordance with an embodiment.

Referring now to FIG. 1D, a perspective view illustration of a SIP module 140 is shown, in accordance with an additional embodiment. In an embodiment, the SIP module 140 may be substantially similar to the SIP module 140 described with respect to FIG. 1C, with the exception that a plurality of land side components 146 are mounted to the bottom surface 143. Since the SIP module 140 bridges the gap between the notch side module 110 and the key side module 120, the bottom surface 143 of the SIP module 140 may be used for additional components without adding to the thickness of the modular package. For example, the components 146 may comprise passive devices, such as capacitors, resistors, or the like. Embodiments may also include components 146 that are active devices, such as ASIC, DRAM, other silicon dies, or the like.

Referring now to FIGS. 2A-2E a series of plan view illustrations are shown that illustrate a process for assembling a modular package is shown, in accordance with an embodiment.

Figure 2A:
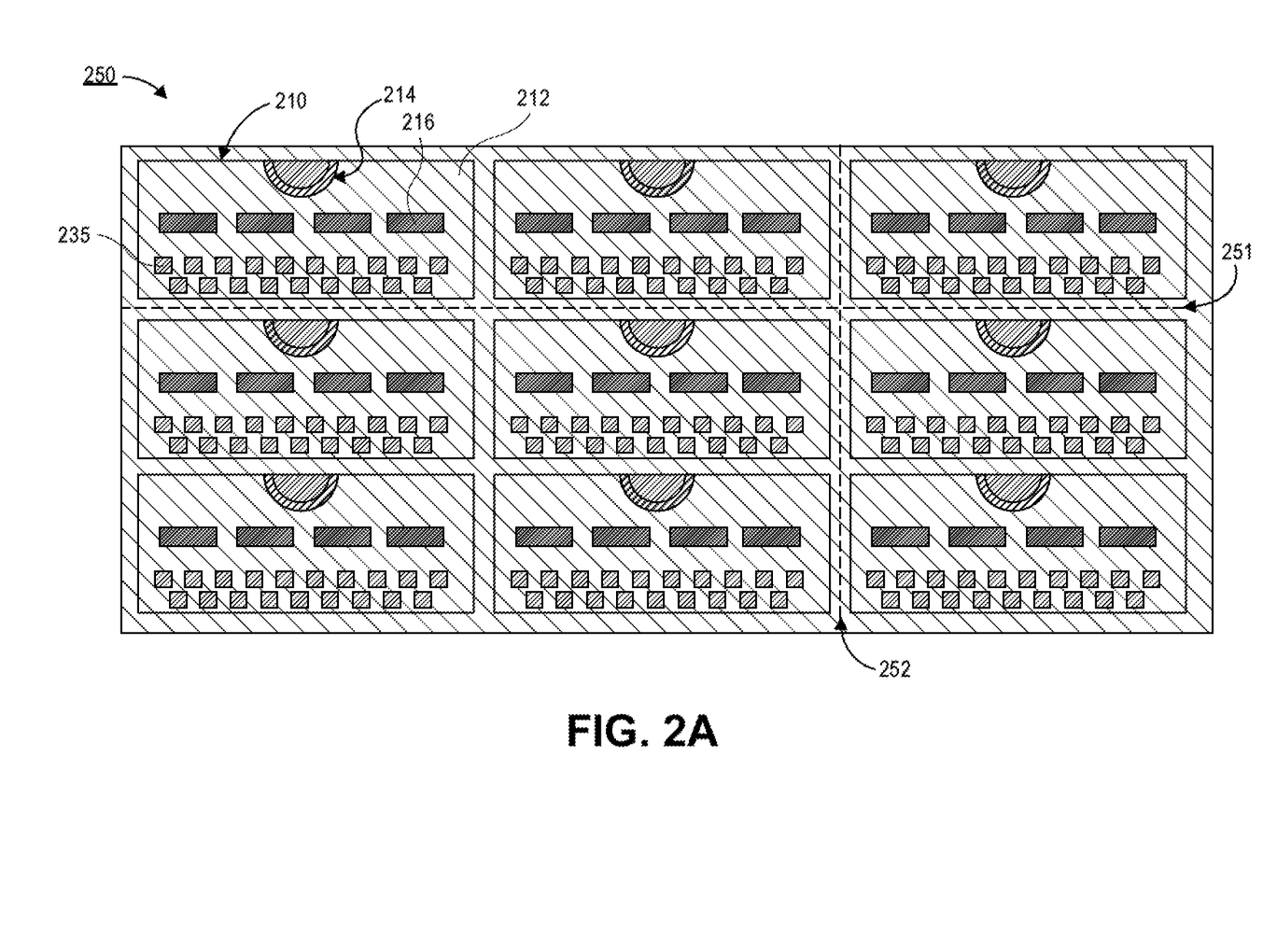
FIG. 2A is a plan view illustration of a plurality of notch side modules on a panel substrate, in accordance with an embodiment.

Referring now to FIG. 2A, a plan view illustration of a panel 250 on which a plurality of notch side modules 210 are formed is shown, in accordance with an embodiment. In an embodiment, the plurality of notch side modules 210 may be substantially similar to notch side module 110 described above. For example, the notch side modules 210 may comprise a plurality of pads 235, a plurality of functional blocks 216, and a notch 214. In an embodiment, the plurality of notch side modules 210 may be formed substantially in parallel with each other on a single panel (e.g., a full panel, a quarter panel, etc.). In an embodiment, the plurality of notch side modules 210 may be separated from each other by saw streets 251 (i.e., horizontal saw streets) and saw streets 252 (i.e., vertical saw streets). In the illustrated embodiment, the outline of the individual notch side modules 210 (i.e., including the outline of where notches are to be formed) is shown for clarity. However, it is to be appreciated that, at the panel level, the notches may not yet be formed. In an embodiment, the plurality of notch side modules 210 may be tested prior to singulation in order to ensure that only functional units are assembled into the modular package.

Figure 2B:
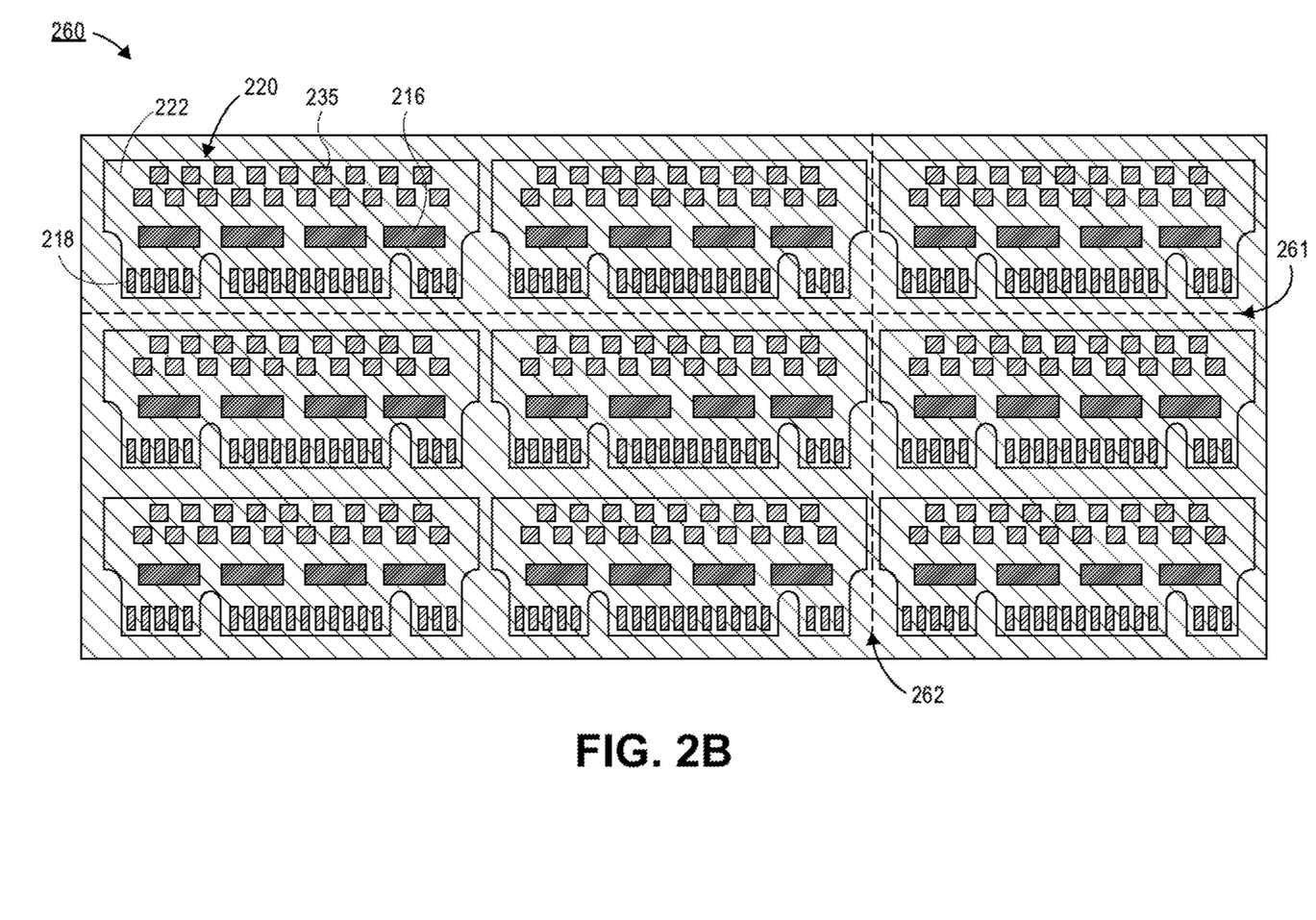
FIG. 2B is a plan view illustration of a plurality of key side modules on a panel substrate, in accordance with an embodiment.

Referring now to FIG. 2B, a plan view illustration of a panel 260 on which a plurality of key side modules 220 are formed is shown, in accordance with an embodiment. In an embodiment, the plurality of key side modules 220 may be substantially similar to key side module 120 described above. For example, the key side modules 220 may comprise a plurality of pads 235, a plurality of functional blocks 216, and a plurality of pads 218. In the illustrated embodiment, the outline of the individual key side modules 220 (i.e., including the outline of where notches are to be formed) is shown for clarity. However, it is to be appreciated that, at the panel level, the notches may not yet be formed.

In an embodiment, the plurality of key side modules 220 may be formed substantially in parallel with each other on a single panel (e.g., a full panel, a quarter panel, etc.). In an embodiment, the plurality of key side modules 220 may be separated from each other by saw streets 261 (i.e., horizontal saw streets) and saw streets 262 (i.e., vertical saw streets). In an embodiment, the plurality of key side modules 210 may be tested prior to singulation in order to ensure that only functional units are assembled into the modular package.

Figure 2C:
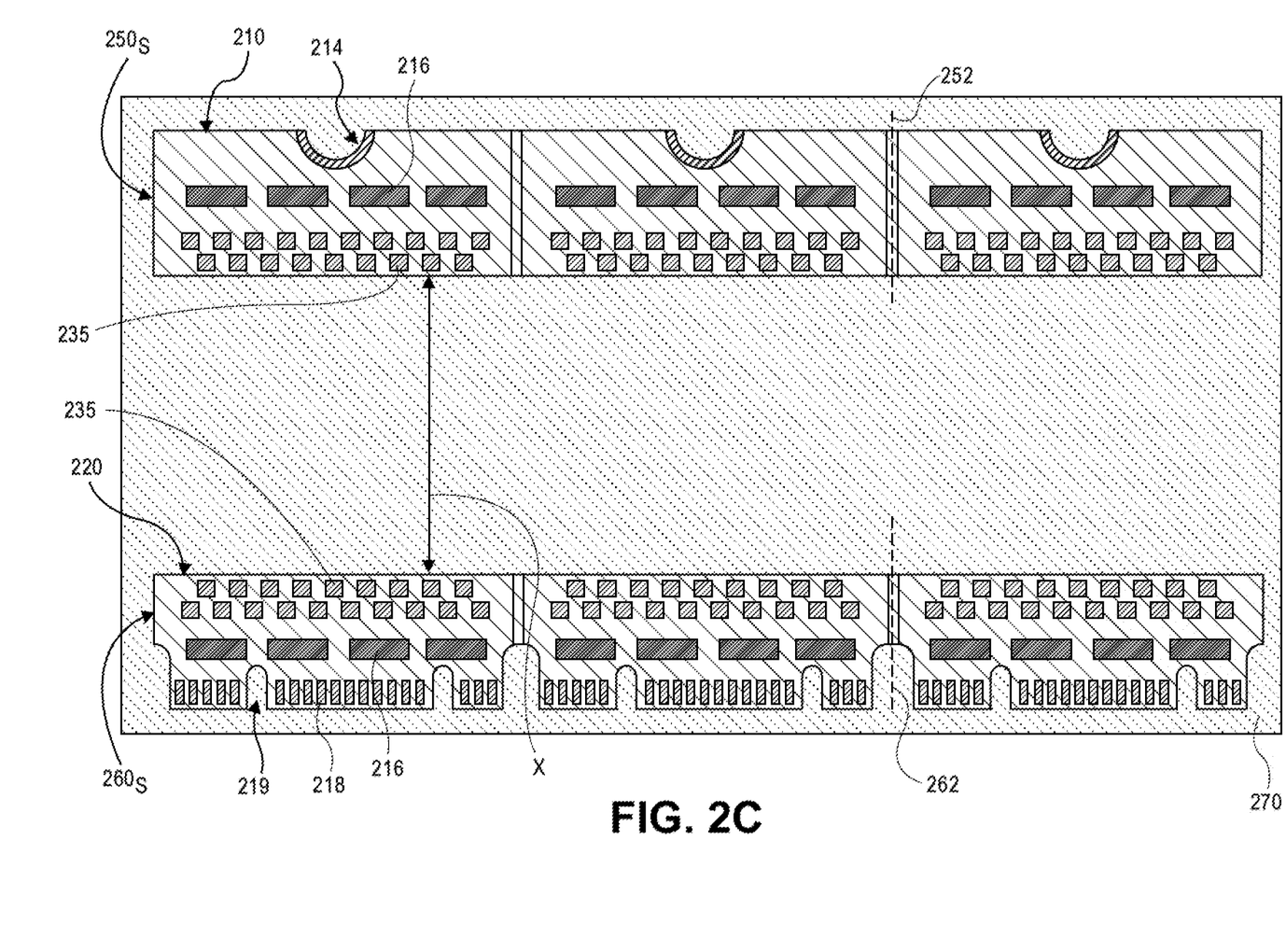
FIG. 2C is a plan view illustration of a strip of notch side modules and a strip of key side modules supported on a carrier, in accordance with an embodiment.

Referring now to FIG. 2C, a plan view illustration of a carrier 270 used for the assembly of the modular packages is shown, in accordance with an embodiment. In an embodiment, the panels (i.e., the notch side module panel 250 and the key side module panel 260) may be singulated to form notch side module strips 250*s* and key side module strips 260*s*, respectively. In an embodiment, each notch side module strip 250*s* may comprise a plurality of laterally adjacent notch side modules 210, and each key side module strip 260*s* may comprise a plurality of laterally adjacent key side modules 220. For example, the notch side module panel may be singulated along horizontal saw streets 251 with a saw and the key side module panel may be singulated along horizontal saw streets 261 with a saw. In an embodiment, the notches 214 may be formed (e.g., with a router) during the singulation. In an embodiment, the notches 219 to form the keying may also be formed (e.g., with a router) during the singulation.

In an embodiment, the notch panel strip 250*s* may be placed on one edge of carrier 270 opposite from the key panel strip 260*s*. In an embodiment, individual ones of the notch side modules 210 may be positioned opposite from individual ones of the key side modules 220 to form end connector pairs. For example, the vertical saw streets 252 of the notch panel strip 250*s* may be aligned with the vertical saw streets 262 of the key panel strip 260*s*. In an embodiment, the notch side modules 210 may be spaced apart from the key side modules 220 by a distance X. For example, the distance X may be chosen to correspond to the dimensions of the SIP module.

Figure 2D:
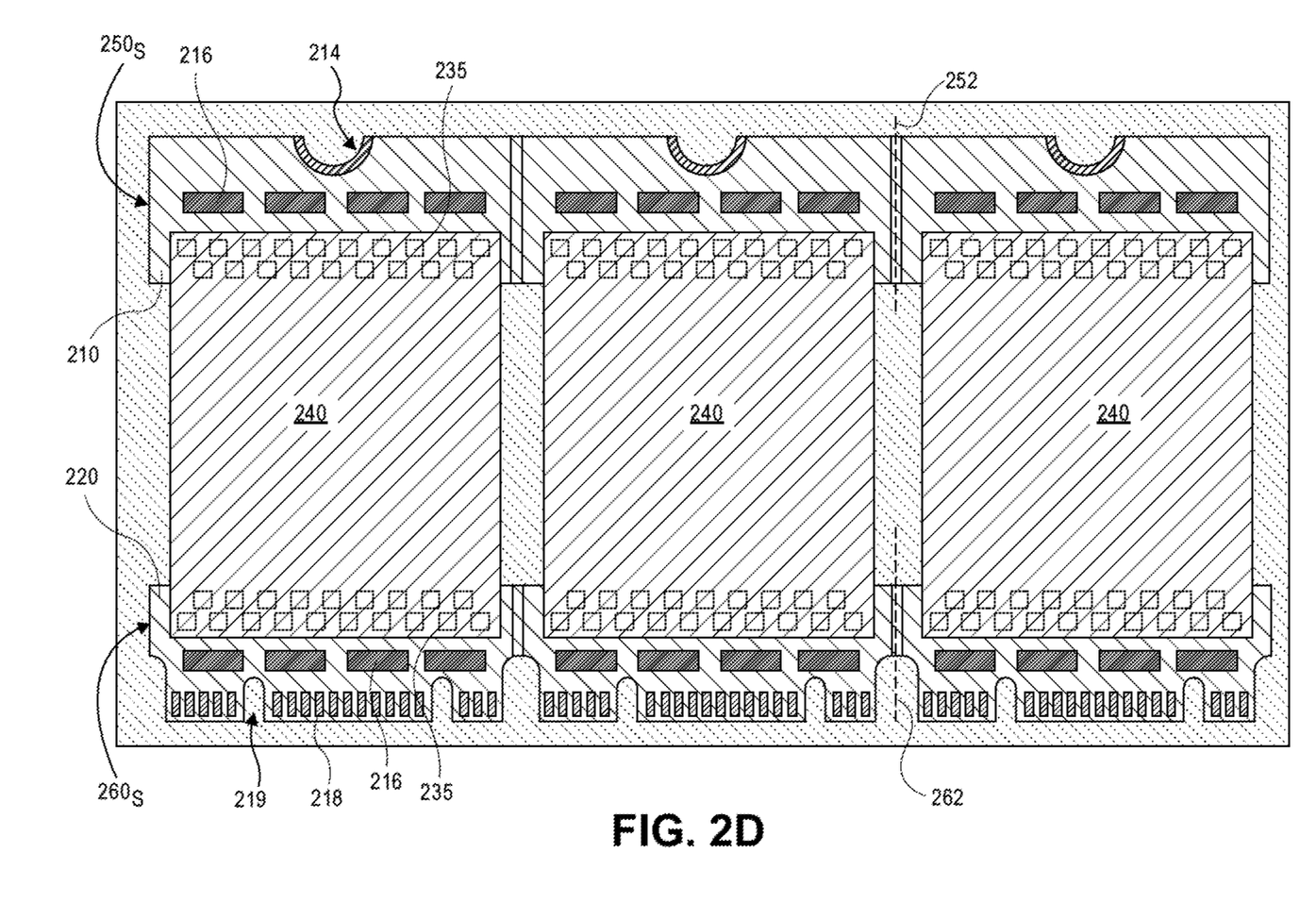
FIG. 2D is a plan view illustration after a plurality of SIP modules are mounted between the notch side modules and the key side modules, in accordance with an embodiment.

Referring now to FIG. 2D, a plan view illustration after a plurality of SIP modules 240 are mounted between pairs of notch side modules 210 and key side modules 220 is shown, in accordance with an embodiment. In an embodiment, the SIP module 240 may be substantially similar to the SIP module 140 described above. For example, the SIP module 240 may comprise any number of dies (not shown) and a plurality of attachment locations for interfacing with the notch side module 210 and the key side module 220.

In the illustrated embodiment, the pads 235 are shown with dashed lines to indicate that they are below the SIP module 240. For example, attachment locations (e.g., BGA balls, pins, or the like) of the SIP module 240 may interface with the pads 235. As shown, the SIP modules 240 each span between a pair of end connectors. That is, each SIP module 240 provides mechanical and electrical coupling between a notch side module 210 and a key side module 220.

Figure 2E:
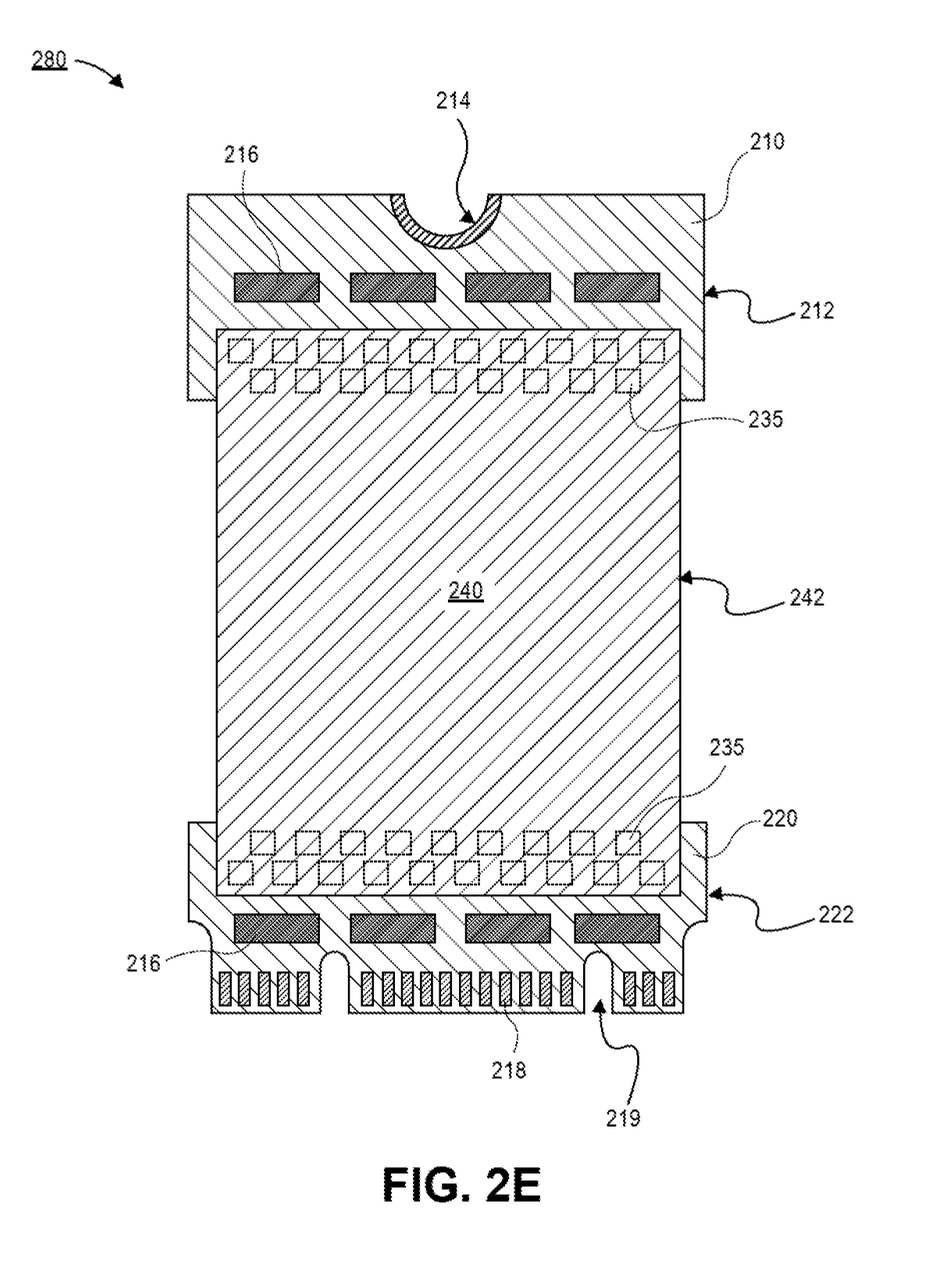
FIG. 2E is a plan view illustration of a singulated modular package, in accordance with an embodiment.

Referring now to FIG. 2E, a plan view illustration of a modular electronics package 280 is shown, in accordance with an embodiment. In an embodiment, the electronics package 280 may be formed by singulating the structure in FIG. 2D along the vertical saw streets 252 and 262 (e.g., with a saw). In an embodiment, the electronics packages 280 may be singulated after being removed from the carrier 270. In an embodiment, the resulting electronics package 280 may comprise a notch side module 210, a key side module 220, and a SIP module 240 between the notch side module 210 and the key side module 220. For example, the electronics package 280 may comprise three distinct PCBs: a first PCB 212 for the notch side module 210, a second PCB 222 for the key side module 220 and a third PCB 242 for the SIP module 240.

Figure 3A:
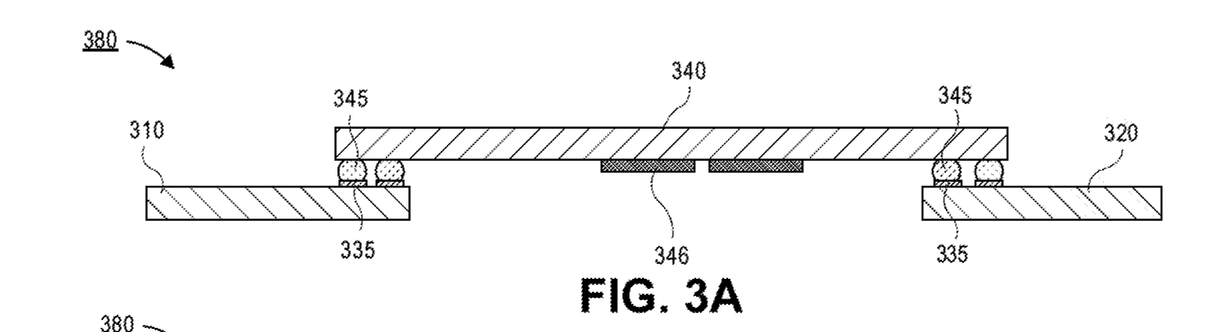
FIG. 3A is a cross-sectional illustration of a modular package, in accordance with an embodiment.
Figure 3B:
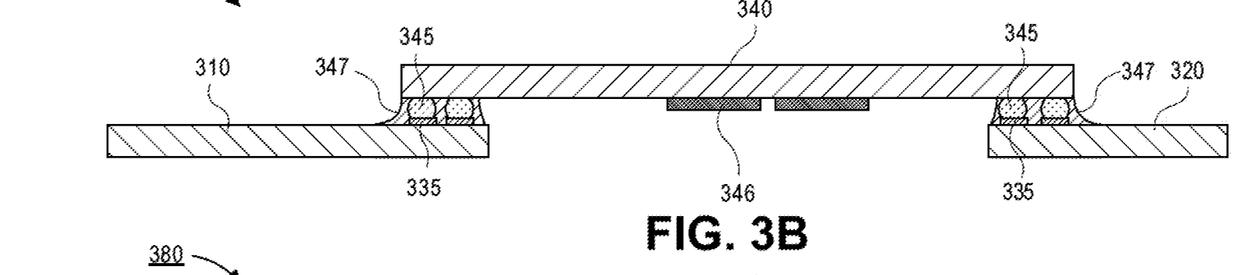
FIG. 3B is a cross-sectional illustration of a modular package with epoxy reinforced solder connections, in accordance with an embodiment.
Figure 3C:
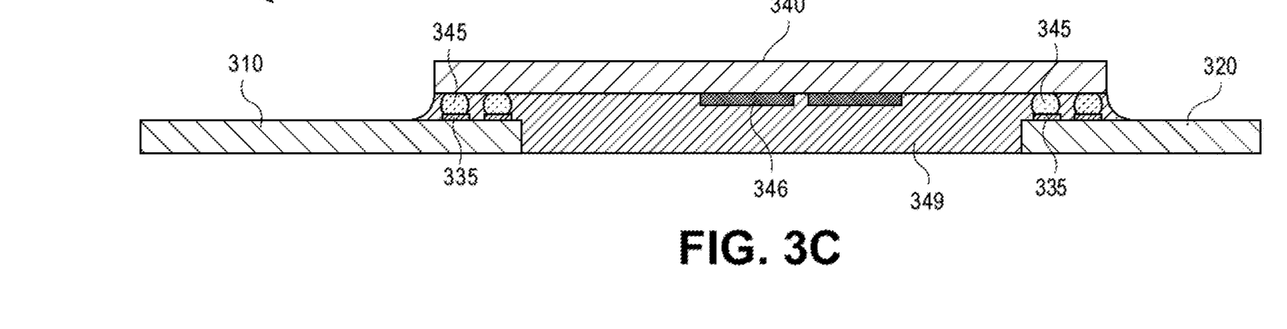
FIG. 3C is a cross-sectional illustration of a modular package with an epoxy underfill to reinforce the package, in accordance with an embodiment.

Referring now to FIGS. 3A-3C, several exemplary cross-sectional illustrations of modular electronics packages 380 are shown, in accordance with various embodiments.

Referring now to FIG. 3A, a cross-sectional illustration of a modular electronics package 380 is shown, in accordance with an embodiment. In an embodiment, the modular electronics package 380 may comprise a notch side module 310, a key side module 320, and a SIP module 340. As shown in the cross-sectional view, the attachment locations 345 (e.g., BGA balls, pins, or the like) of the SIP module 340 are coupled to the pads 335 on the notch side module 310 and the key side module 320. Accordingly, the SIP module 340 is above the notch side module 310 and the key side module 320. That is, the bottom surface of SIP module 340 is above top surfaces of the notch side module 310 and the key side module 320.

In an embodiment, the SIP module 340 may be referred to as "spanning" the gap between the notch side module 310 and the key side module 320. Since the SIP module 340 spans the gap, there is no PCB underlying the SIP module 340. Accordingly, in some embodiments, one or more land side components 346 may be mounted to the SIP module 340. Since the thickness of the land side components 346 is hidden by the thickness of the notch side module 310, the key side module 320 and the attachment locations 345, the modular electronics package 380 does not require additional Z-height clearance to add the land side components 346.

Referring now to FIG. 3B, a cross-sectional illustration of a modular electronics package 380 with epoxy reinforced connections is shown, in accordance with an embodiment. Modular electronics package 380 is substantially similar to the modular electronics package 380 in FIG. 3A, with the exception that an epoxy 347 is applied around the attachment locations 345. In an embodiment, the epoxy 347 may improve reliability of the modular electronics package 380.

The modular electronics package 380 may also differ from the electronics package 380 in FIG. 3A in that the notch side module 310 has a different form factor than the notch side module 310 in FIG. 3A. For example, the notch side module 310 in FIG. 3A may be suitable for a first form factor, and the notch side module 310 in FIG. 3B may be suitable for a second form factor (e.g., the first form factor may be 22×30 mm and the second form factor may be 22×42 mm). In additional embodiments, the form factors may include an X dimension and a Y dimension such as, 22×30 mm, 22×42 mm, 22×60 mm, 22×80 mm, 22×110 mm, or the like. Since the modular components are interchangeable, the conversion of the modular electronics package from the first form factor to the second form factor may be made with the substitution of a different notch side module 310 instead of having to completely redesign the electronics package. Similarly, the key side module 320 and/or the SIP module 340 may also be interchangeable in order to provide further customization of the modular electronics package 380.

Referring now to FIG. 3C, a cross-sectional illustration of a modular electronics package 380 with an under-molded SIP is shown, in accordance with an embodiment. In an embodiment, the modular electronics package 380 may be substantially similar to the modular electronics package 380 in FIG. 3B with the exception that the SIP module 340 includes an under-molded layer 349. For example, a molding material (e.g., an epoxy or the like) may be molded over a bottom surface of the SIP module 340. The use of an under-molded layer 349 may increase the reliability of the modular electronics package 380. Furthermore, it is to be appreciated that an overmolded layer may also be used (or used instead of an under-molded layer) to increase reliability of the modular electronics package 380.

Figure 4:
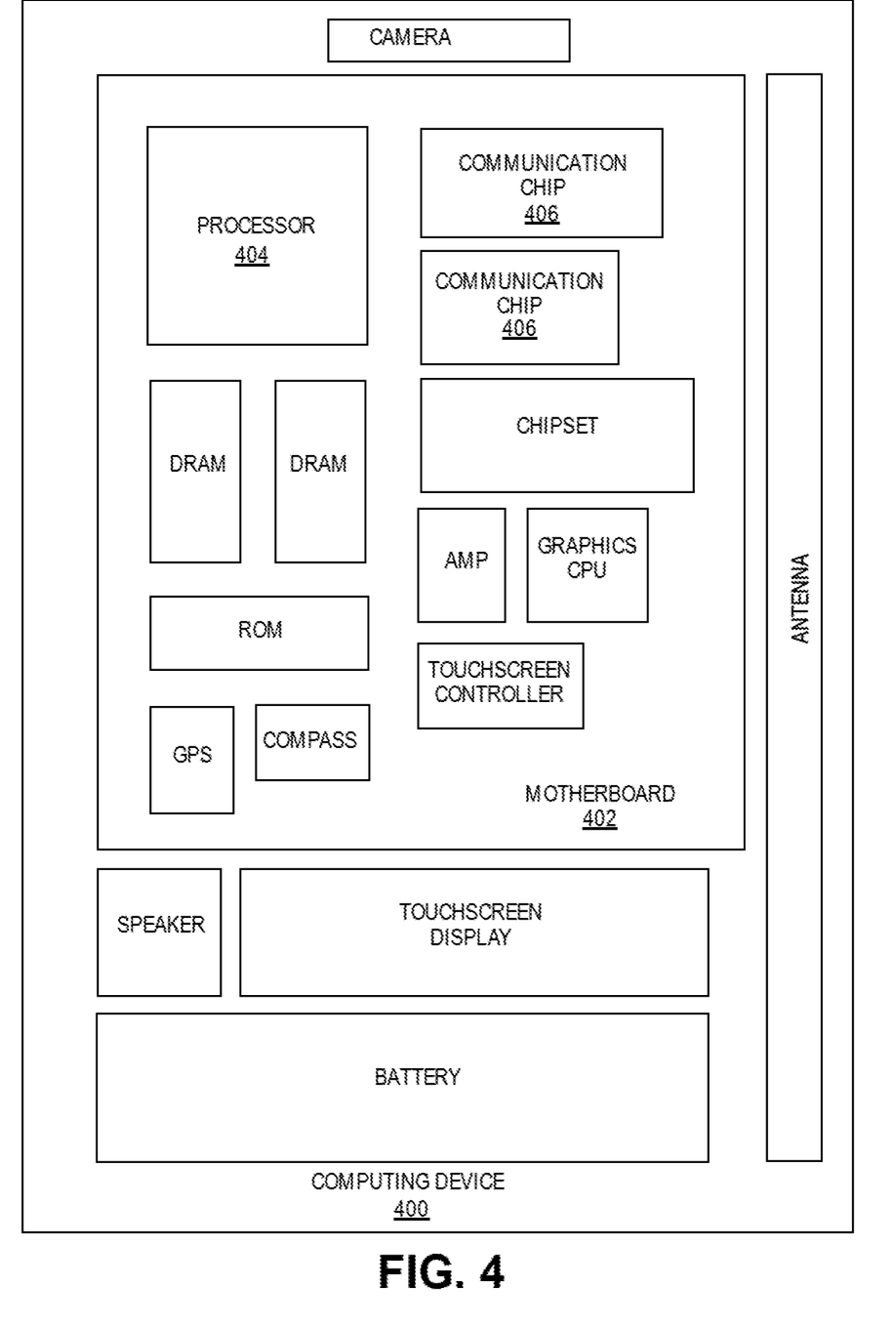
FIG. 4 is a schematic of a computing device built in accordance with an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be packaged as part of a modular electronics package, in accordance with embodiments described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be packaged as part of a modular electronics package, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronics package, comprising: a first connector module having a notch on a first end and a plurality of surface mount technology (SMT) pads on a second end; a second connector module having a keyed connector on a first end and a plurality of SMT pads on a second end; and a system in package (SIP) module between the first connector and the second connector, the component module electrically and mechanically coupled to the SMT pads of the first connector and the SMT pads of the second connector.

Example 2: the electronics package of Example 1, wherein the SIP module comprises memory components.

Example 3: the electronics package of Example 1 or Example 2, wherein the memory components are a solid state drive (SSD).

Example 4: the electronics package of Examples 1-3, further comprising a land side component on the SIP module.

Example 5 the electronics package of Examples 1-4, wherein the SIP module is coupled to the SMT pads with ball grid array (BGA) balls, a pin grid array (PGA), or a land grid array (LGA).

Example 6: the electronics package of Examples 1-5, further comprising epoxy surrounding the BGA balls, PGA, or LGA.

Example 7: the electronics package of Examples 1-6, wherein the electronics package has a form factor with an X dimension and a Y dimension.

Example 8: the electronics package of Examples 1-7, wherein the X dimension and the Y dimension are 22×30 mm, 22×42 mm, 22×60 mm, 22×80 mm, or 22×110 mm.

Example 9: the electronics package of Examples 1-9, wherein one or more of the power, debug, SPI flash, and crystal circuitry blocks are on the first connector module or the second connector module.

Example 10: the electronics package of Examples 1-10, wherein the second connector module is a M.2 connector.

Example 11: a method of forming an electronics package, comprising: forming a plurality of first end connectors on a first PCB strip; forming a plurality of second end connectors on a second PCB strip; placing the first PCB strip and the second PCB strip on a carrier, wherein first end connectors are aligned with second end connectors to form a plurality of end connector pairs; and coupling the first end connector to the second end connector in each end connector pair with a system in package (SIP) module.

Example 12: the method of Example 11, wherein each SIP module is coupled to the first end connector and the second end connector with ball grid array (BGA) balls, pin grid array (PGA), or land grid array (LGA).

Example 13: the method of Example 11 or Example 12, further comprising: depositing epoxy around the BGA balls, PGA, or LGA.

Example 14: the method of Examples 11-13, further comprising: removing the carrier.

Example 15: the method of Examples 11-14, further comprising: singulating the first PCB strip and the second PCB strip.

Example 16: the method of Examples 11-15, wherein the SIP module comprises memory components.

Example 17: the method of Examples 11-16, wherein the memory components are solid state drive (SSD) memories.

Example 18: the method of Examples 11-17, wherein the first connector module comprises a notch, and wherein the second connector comprises keys.

Example 19: the method of Examples 11-18, wherein the second connector is a M.2 connector.

Example 20: the method of Examples 11-19, wherein the electronics package has a form factor with an X dimension and a Y dimension.

Example 21: the method of Examples 11-20, wherein the X dimension and the Y dimension are 22×30 mm, 22×42 mm, 22×60 mm, 22×80 mm, or 22×110 mm.

Example 22: the method of Examples 11-21, wherein the SIP module comprises land side components.

Example 23: an electronics package, comprising: a first connector module having a notch on a first end and a plurality of surface mount technology (SMT) pads on a second end, wherein the first connector module is formed on a first printed circuit board (PCB); a second connector module having a keyed connector on a first end and a plurality of SMT pads on a second end, wherein the second connector module is formed on a second PCB that is different than the first PCB; and a system in package (SIP) module spanning a gap between the first connector and the second connector, the component module electrically and mechanically coupled to the SMT pads of the first connector and the SMT pads of the second connector with ball grid array (BGA) balls, pin grid array (PGA), or land grid array (LGA), wherein the SIP module is on a third PCB, and wherein a bottom surface of the third PCB is above top surfaces of the first PCB and the second PCB.

Example 24: the electronics package of Example 23, wherein the second connector is a M.2 connector.

Example 25: the electronics package of Example 23 or Example 24, wherein the SIP module is a solid state drive (SSD) module.

What is claimed is:

1. An electronics package, comprising:
   a first connector module having a notch on a first end and a first plurality of surface mount technology (SMT) pads on a second end, and the first connector module comprising one or more functional blocks intervening between the notch and the plurality of SMT pads;
   a second connector module having a keyed connector on a first end and a second plurality of SMT pads on a second end; and
   a system in package (SIP) module between the first connector module and the second connector module, the component SIP module electrically and mechanically coupled to the SMT pads of the first connector module and the SMT pads of the second connector module;
   wherein the SIP module is coupled to the first and second SMT pads with ball grid array (BGA) balls, a pin grid array (PGA), or a land grid array (LGA); and
   wherein the one or more functional blocks comprised one or more of power, debug, SPI flash, and crystal circuitry blocks are on the first connector module or the second connector module.

2. The electronics package of claim 1, wherein the SIP module comprises memory components.

3. The electronics package of claim 1, further comprising a land side component on the SIP module.

4. The electronics package of claim 1, further comprising epoxy surrounding the BGA balls, PGA, or LGA.

5. The electronics package of claim 1, wherein the electronics package has a form factor with an X dimension and a Y dimension.

6. The electronics package of claim 1, wherein the second connector module is a M.2 connector.

7. The electronics package of claim 2, wherein the memory components are a solid state drive (SSD).

8. The electronics package of claim 5, wherein the X dimension and the Y dimension are 22×30 mm, 22×42 mm, 22×60 mm, 22×80 mm, or 22×110 mm.

9. A method of forming an electronics package, comprising:
   forming a plurality of first end connectors on a first PCB strip, wherein each of the first end connectors have a notch on a first end and a first plurality of surface mount technology (SMT) pads on a second end, and each of the first end connectors comprising one or more functional blocks intervening between the notch and the plurality of SMT pads;
   forming a plurality of second end connectors on a second PCB strip, and each of the second connector module having a keyed connector on a first end and a second plurality of SMT pads on a second end; and
   placing the first PCB strip and the second PCB strip on a carrier, wherein first end connectors are aligned with second end connectors to form a plurality of end connector pairs; and
   coupling the first end connector to the second end connector in each end connector pair with a system in package (SIP) module;
   wherein the package (SIP) module is coupled to the first and second SMT pads with ball grid array (BGA) balls, a pin grid array (PGA), or a land grid array (LGA); and
   wherein the one or more functional blocks comprised one or more of power, debug, SPI flash, and crystal circuitry blocks are on the first connector module or the second connector module.

10. The method of claim 9, further comprising:
    depositing epoxy around the BGA balls, PGA, or LGA.

11. The method of claim 9, further comprising:
    removing the carrier.

12. The method of claim 9, wherein the SIP module comprises memory components.

13. The method of claim 9, wherein the second connector module is a M.2 connector.

14. The method of claim 9, wherein the electronics package has a form factor with an X dimension and a Y dimension.

15. The method of claim 9, wherein the SIP module comprises land side components.

16. The method of claim 11, further comprising:
    singulating the first PCB strip and the second PCB strip.

17. The method of claim 12, wherein the memory components are solid state drive (SSD) memories.

18. The method of claim 14, wherein the X dimension and the Y dimension are 22×30 mm, 22×42 mm, 22×60 mm, 22×80 mm, or 22×110 mm.

19. An electronics package, comprising:
    a first connector module having a notch on a first end and a first plurality of surface mount technology (SMT) pads on a second end, and the first connector module comprising one or more functional blocks intervening between the notch and the plurality of SMT pads, wherein the first connector module is formed on a first printed circuit board (PCB);

a second connector module having a keyed connector on a first end and a second plurality of SMT pads on a second end, wherein the second connector module is formed on a second PCB that is different than the first PCB; and a system in package (SIP) module spanning a gap between the first connector module and the second connector module, the component SIP module electrically and mechanically coupled to the SMT pads of the first connector module and the SMT pads of the second connector module with ball grid array (BGA) balls, pin grid array (PGA), or land grid array (LGA), wherein the SIP module is on a third PCB, and wherein a bottom surface of the third PCB is above top surfaces of the first PCB and the second PCB;

wherein the one or more functional blocks comprised one or more of power, debug, SPI flash, and crystal circuitry blocks are on the first connector module or the second connector module.

20. The electronics package of claim 19, wherein the second connector module is a M.2 connector.

21. The electronics package of claim 19, wherein the SIP module is a solid state drive (SSD) module.

* * * * *